United States Patent
Jung et al.

(10) Patent No.: US 6,372,576 B2
(45) Date of Patent: Apr. 16, 2002

(54) METHOD FOR MANUFACTURING A FLOATING GATE IN A FLASH MEMORY DEVICE

(75) Inventors: Sung Mun Jung, Ichon-shi; Sang Bum Lee, Cheongju-shi; Jum Soo Kim, Ichon-shi, all of (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/879,645

(22) Filed: Jun. 12, 2001

(30) Foreign Application Priority Data

Jun. 26, 2000 (KR) ......................................... 2000-35358

(51) Int. Cl.$^7$ ................................................ H01L 2/336
(52) U.S. Cl. ........................ 438/257; 438/264; 438/266
(58) Field of Search ................................. 438/257, 258, 438/259, 261, 262, 263, 264, 265, 266

(56) References Cited

U.S. PATENT DOCUMENTS 5,874,759 A * 2/1999 Park ............................. 257/314
5,915,176 A * 6/1999 Lim ............................. 438/257

* cited by examiner

*Primary Examiner*—Chandra Chaudhari
*Assistant Examiner*—Jack Chen
(74) *Attorney, Agent, or Firm*—Marshall, Gerstein, & Borun.

(57) ABSTRACT

There is disclosed a method of manufacturing a floating gate in a flash memory device. In order to minimize the distance between floating gates, the method includes patterning a polysilicon film using a first PSG pattern in which a second PSG spacer is formed on and at the sidewall of the polysilicon film, and removing the first PSG film pattern and the second PSG film spacer using 50:1 HF or 9:1 BOE. Therefore, it can minimize the size of the device without damaging a polysilicon film and a field oxide.

5 Claims, 2 Drawing Sheets

METHOD FOR MANUFACTURING A FLOATING GATE IN A FLASH MEMORY DEVICE

BACKGROUND OF THE INVENTION

1. Field of the Invention

A method of manufacturing a floating gate in a flash memory device is disclosed. More particularly, a method of manufacturing a floating gate in a flash memory device, which can minimize the size of the device without damaging a polysilicon film and a field oxide film is disclosed.

2. Description of the Prior Art

The size of a flash memory device, in which a floating gate and a control gate are stacked to form a word line, is determined by the distance between the floating gates formed to be overlapped with a given region on a field oxide film. That is, in order to reduce the size of the device, the distance between the floating gates must be reduced. Though various methods have been proposed, they cause many problems when being applied in a mass production process, and, as a result most of which have not implemented.

As one example, a method by will be explained by which the distance between the floating gates is made less 0.15 µm using a relatively large design rule ranging from 0.35 µm to about 0.25 µm without additional equipment.

A tunnel oxide film, a polysilicon film and a first nitride film are sequentially formed on a semiconductor substrate on a given region of which a field oxide film is formed. Next, the first nitride film is patterned by lithography process and etching process using a mask for floating gate. The first nitride film is patterned to be overlapped with a given region of the field oxide film. Then, a spacer is formed at the sidewall of the first nitride film by means of a second nitride film. Thereafter, the polysilicon film and the tunnel oxide film are etched using the nitride film pattern in which the spacer is formed as a mask. Thus, the nitride pattern is removed to form a floating gate.

If the floating gate is formed by the above process, the nitride film and the nitride spacer are removed by means of wet etch process using $H_3PO_4$. However, the underlying polysilicon film is damaged by the $H_3PO_4$, which may critically affect the operation of the device.

In order to solve this problem, a CVD oxide film is used instead of the nitride film and a CVD oxide film wet etch or dry etch process using BOE or HF is employed. However, another problem is associated with this technique in that the field oxide film is exposed by the etching process is consequently etched.

SUMMARY OF THE DISCLOSURE

A method of manufacturing a floating gate in a flash memory device, which can minimize the distance between floating gates using a relatively large design rule is disclosed.

Further, a method of manufacturing a floating gate in a flash memory device, which can minimize the distance between floating gates without damaging a polysilicon film and a field oxide film is disclosed.

The disclosed method is characterized in that it comprises the steps of forming a tunnel oxide film and a polysilicon film on a semiconductor substrate on a portion of which a field oxide film is formed; forming a first PSG film on the polysilicon film and then patterning the first PSG film; forming a second PSG film on the entire structure and then blanket-etching the second PSG film, thus forming a spacer at the sidewall of the first PSG film pattern; etching the polysilicon film and the tunnel oxide film by means of etching process, using the first PSG film pattern at which the spacer is formed as a mask; and removing the first PSG film pattern and the spacer.

BRIEF DESCRIPTION OF THE DRAWINGS

The aforementioned aspects and other features of the disclosed method will be explained in the following description, taken in conjunction with the accompanying drawings, wherein.

DETAILED DESCRIPTION OF THE PRESENTLY PREFERRED EMBODIMENTS

The disclosed method will be described in detail by way of a preferred embodiment with reference to accompanying drawings.

Figure 1A:
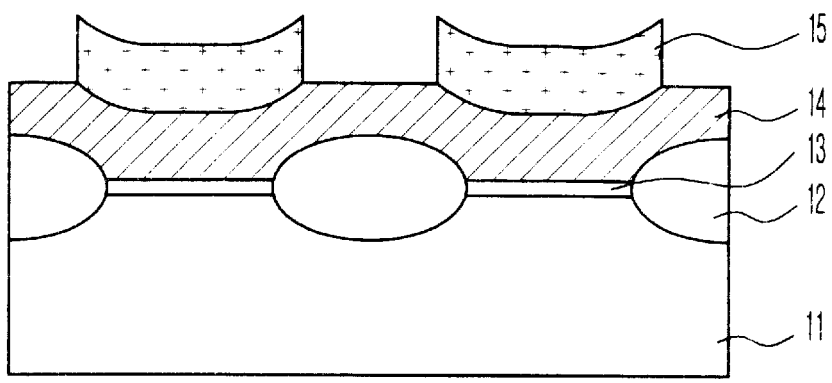
FIGS. 1A to 1C are cross-sectional views illustrating a method of manufacturing a floating gate in a flash memory device according to one disclosed method.
Figure 1B:
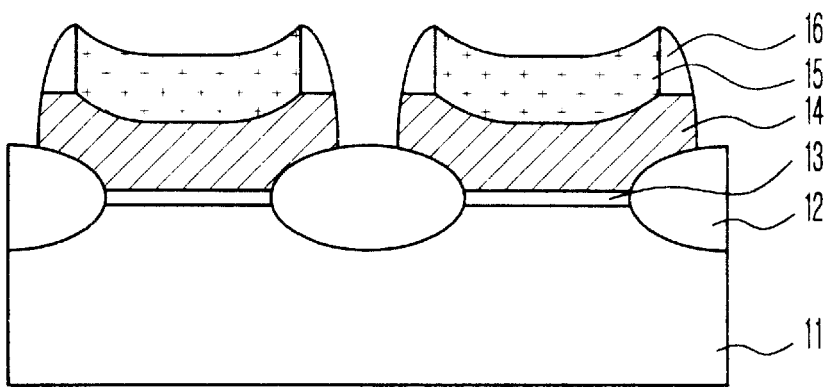
Figure 1C:
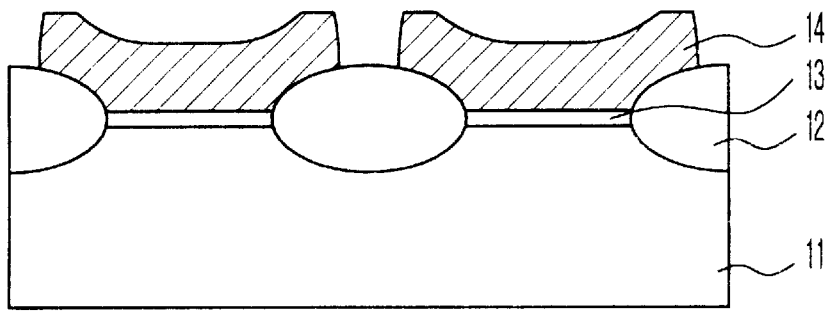

FIGS. 1A to 1C are cross-sectional views for explaining a method of manufacturing a floating gate in a flash memory device. Referring now to FIG. 1A, a field oxide film 12 is formed on a given region of a semiconductor substrate 11. Then, a tunnel oxide film 13 and a polysilicon film 14 are formed on the entire structure. Next, a first PSG film 15 is formed on the polysilicon film 14. Then, the first PSG film 15 is patterned by means of lithography and etching process using a mask for floating gate. The first PSG film 15 is formed to be overlapped with a given region of the field oxide film 12. At this time, the polysilicon film 14 is formed with a thickness ranging from about 400 Å to about 1000 Å and the first PSG film 15 is formed with a thickness ranging from about 400 Å to about 2500 Å.

Referring now to FIG. 1B, a second PSG film (not specifically shown in FIG. 1B, see the spacer 16) is formed with a thickness ranging from about 400 Å to about 2500 Å on the entire structure including the patterned first PSG film 15. The second PSG film is etched by means of blanket-etching process to form a spacer 16 at the sidewall of the first PSG film 15. The polysilicon 14 and the tunnel oxide film 13 are etched using the first PSG film 15 at which the spacer 16 is formed as a mask.

Referring now to FIG. 1C, the spacer 16 and the first PSG film 15 are removed to form a floating gate. At this time, the spacer 16 and the first PSG film 15 both of which are formed by the second PSG film, are removed by HF or BOE, wherein it is preferably removed by solution with 50:1 HF or 9:1 BOE.

Figure 2:
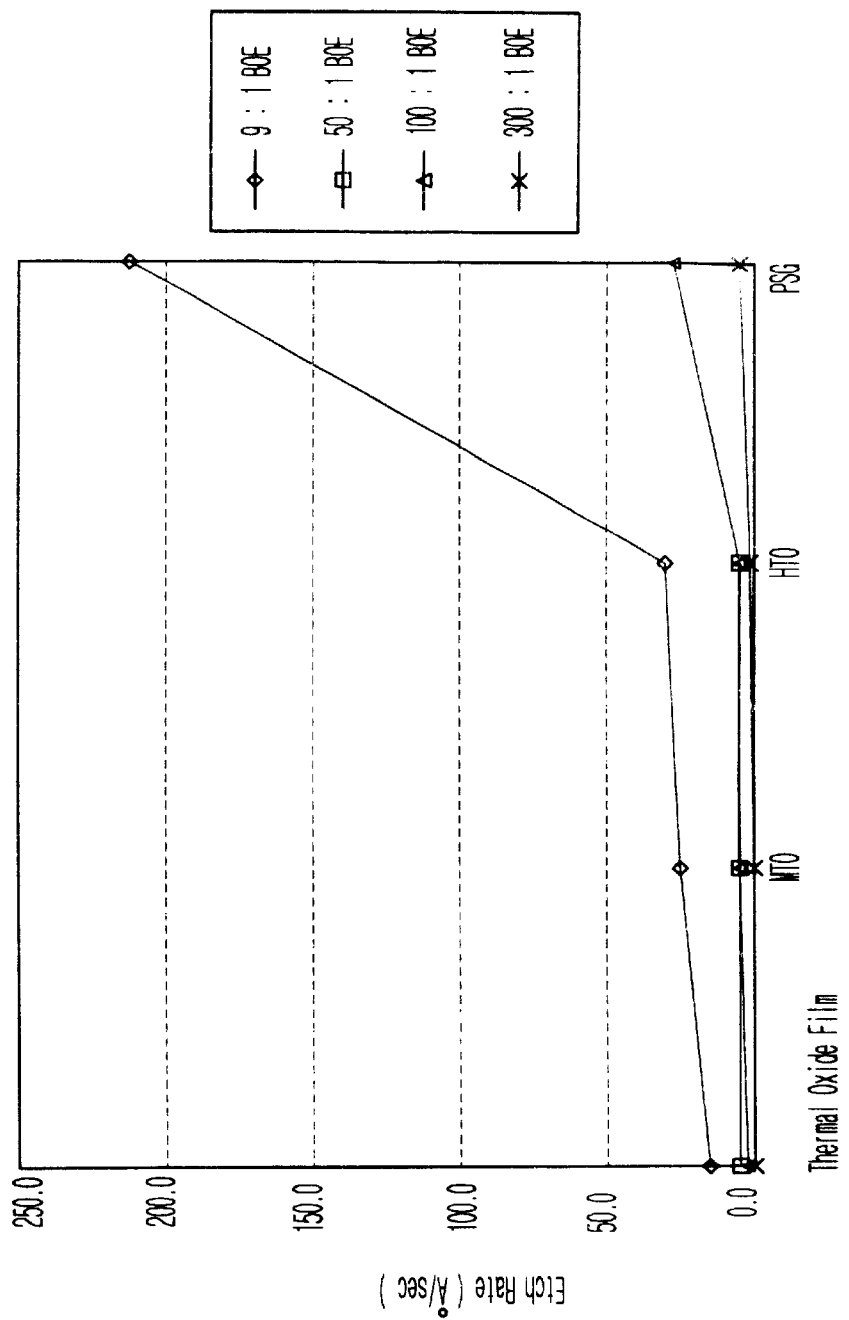
FIG. 2 is a graph showing etch ratio depending on the concentration of an oxide film and BOE.

Table 1 and Table 2 show etch ratio depending on etch solutions for various films and FIG. 2 is a graph showing etch ratio depending on the concentration of the oxide film and BOE.

TABLE 1

| ITEM | | | 50HF | | 100HF |
|---|---|---|---|---|---|
| THERMAL | | FOX | 1.0 | 0.6 | 100" |
| | | SAC | | | |
| LTO | | AS DEP. | 8.0 | 4.1 | |
| | | ANNEALED | | | |
| MTO | | AS DEP. | 2.5 | 1.2 | 780/1.2 torr |
| | | ANNEALED | 2.1 | | N2O:SiH4 = 4000:80 sccm |
| HTO | | AS DEP. | 2.9 | 0.5 | 850/0.8 torr |
| | | ANNEALED | 3.1 | | N2O:DCS = 600:60 sccm |
| TEOS | PETEOS | AS DEP. | 2.5 | 1.8 | 100" |
| | | ANNEALED | | | |
| | LPTEOS | AS DEP. | 7.0 | 3.3 | 710/0.4 torr |
| | | ANNEALED | 3.6  100" | 1.2 | 100" TEOS:O2 = 120:5 sccm |
| BPSG | #166 | AS DEP. | 17.2 | 8.3 | 550/03 107 g/cm2 |
| | | ANNEALED | 8.3 | 4.1 | TMB:TMP = 16:6 Mol % |
| | | FTPS | 8.1 | 4.2 | 850/30' A&F |
| | #186 | AS DEP. | 22.4 | 9.6 | 550/03 107 g/cm2 |
| | | ANNEALED | 9.5 | 4.7 | TMB:TMP = 18:6 Mol % |
| | | FTPS | 9.3 | 4.7 | 850/30' A&F |
| PSG | O3 PSG | AS DEP. | 66.0 | 15.4 | 100" |
| | | ANNEALED | 58.4 | | |
| OXY NITRIDE | PE OXY | AS DEP. | 1.4 | 0.5 | 100" |
| | | ANNEALED | | | |
| | PEMSOXY | AS DEP. | 13.9 | | |
| | | ANNEALED | | | |
| ANNEAL ENVIRONMENT | | | 850/30' | | 850/20' (850/30') |

TABLE 2

| ITEM | | | 9BOE | 50BOE | 100BOE | 300BOE |
|---|---|---|---|---|---|---|
| THERMAL | | FOX | 14.8 | 3.1 | 1.5 | 0.2 |
| | | SAC | | | | |
| LTO | | AS DEP. | 52.6 | 6.6 | | |
| | | ANNEALED | | | | |
| MTO | | AS DEP. | 27.5 | 4.4 | 3.8 | 0.7 |
| | | ANNEALED | | | 3.4 | |
| HTO | | AS DEP. | 33.4 | 5.2 | 5.1 | 1.2 |
| | | ANNEALED | | | 5.0 | |
| TEOS | PETEOS | AS DEP. | | 8.6 | 4.4 | |
| | | ANNEALED | | | | |
| | LPTEOS | AS DEP. | 71.6 | | 9.8 | |
| | | ANNEALED | | | 4.4  100" | |
| BSPG | #166 | AS DEP. | | | 7.5 | 1.5 |
| | | ANNEALED | | | 3.8 | |
| | | FTPS | | | 3.8 | |
| | #186 | AS DEP. | | | 7.3 | 1.5 |
| | | ANNEALED | | | 3.9 | |
| | | FTPS | | | 3.8 | |
| PSG | O3 PSG | AS DEP. | 214.5  50" | | 22.6  50" | 3.4 |
| | | ANNEALED | 137.8  50" | | 15.6  50" | |
| OXY NITRIDE | PE OXY | AS DEP. | 30.2  50" | | 1.8 | 0.7  50" |
| | | ANNEALED | | | | |
| | PEMSOXY | AS DEP. | 29.0  50" | | 5.8  50" | 1.3  50" |
| | | ANNEALED | | | | |
| ANNEAL ENVIRONMENT | | | 850/30' | | 850/30' | |

As shown in Tables 1 and 2, for example, in case of using 50:1 HF, a thermal oxide film is etched by 1 Å per second and the PSG film is etched by 11 Å per second.

Therefore, the thermal oxide film and the PSG film has the etch ratio of 66:1, respectively.

Therefore, for example, when a PSG film having the thickness of 1000 Å is removed, the field oxide film is etched or damaged by 15.15 Å.

As mentioned above, according to the present invention, the distance between the floating gates can be minimized without damaging a polysilicon film and a field oxide film used in a floating gate. Therefore, it can reduce the size of a device and can thus improve reliability of the device.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed:

1. A method of manufacturing a floating gate in a flash memory device, comprising the steps of:

providing a semiconductor substrate that comprises a first portion that is covered with a field oxide film and a second portion that is not covered with the field oxide film;

forming a tunnel oxide film on the second portion of the semiconductor substrate that is not covered with the field oxide film;

forming a polysilicon film on the tunnel oxide film and the field oxide film;

forming a first PSG film on the polysilicon film;

patterning the first PSG film to form a sidewall of the first PSG film;

forming a second PSG film on an entire structure;

blanket-etching the second PSG film, thus forming a spacer at the sidewall of the first PSG film;

etching said polysilicon film and said tunnel oxide film by means of etching process, using said first PSG film and the spacer as a mask; and removing said first PSG film and the spacer.

2. The method of manufacturing a floating gate in a flash memory device according to claim 1, wherein said polysilicon film is formed with a thickness ranging from about 400 Å to about 1000 Å.

3. The method of manufacturing a floating gate in a flash memory device according to claim 1, wherein said first PSG film is formed with a thickness ranging from about 400 Å to about 2500 Å.

4. The method of manufacturing a floating gate in a flash memory device according to claim 1, wherein said second PSG film is formed with thickness ranging from about 400 Å to about 2500 Å.

5. The method of manufacturing a floating gate in a flash memory device according to claim 1, wherein said first PSG film and said spacer are removed by 50:1 HF or 9:1 BOE.

* * * * *